United States Patent [19]
Buchta et al.

[11] Patent Number: 5,491,112
[45] Date of Patent: Feb. 13, 1996

[54] METHOD AND ARRANGEMENT FOR TREATING SILICON PLATES

[75] Inventors: Rudolf Buchta, Österskär; Yngve Hässler, Lindingö, both of Sweden

[73] Assignee: Im Institutet För Mikroelektronik, Kista, Sweden

[21] Appl. No.: 155,154

[22] Filed: Nov. 19, 1993

Related U.S. Application Data

[63] Continuation of Ser. No. 781,139, filed as PCT/SE90/00463 Jun. 27, 1990, abandoned.

[30] Foreign Application Priority Data

Jun. 30, 1989 [SE] Sweden .................................. 8902391

[51] Int. Cl.⁶ .................................................. H01L 21/302
[52] U.S. Cl. ........................... 437/225; 437/228; 118/725; 156/345
[58] Field of Search ...................... 437/225, 228; 117/92; 118/723 MW, 724, 725; 156/345

[56] References Cited

U.S. PATENT DOCUMENTS

| | | | |
|---|---|---|---|
| 4,517,026 | 5/1985 | Inoue | 148/1.5 |
| 4,522,149 | 6/1985 | Garbis et al. | 118/725 |
| 4,529,621 | 7/1985 | Ballard | 427/95 |
| 4,778,559 | 10/1988 | McNeilly | 118/725 |

FOREIGN PATENT DOCUMENTS

| | | |
|---|---|---|
| 3742110 | 6/1988 | Germany . |
| 3739895 | 6/1988 | Germany . |
| 0125621 | 7/1984 | Japan . |
| 59-125621 | 7/1984 | Japan . |
| 59-181530 | 10/1984 | Japan . |
| 63-186874 | 8/1988 | Japan . |
| 8001363 | 7/1980 | WIPO . |

*Primary Examiner*—R. Bruce Breneman
*Attorney, Agent, or Firm*—Nies, Kurz, Bergert & Tamburro

[57] ABSTRACT

A method for treating a silicon plate, a so-called wafer, in a cold-wall reactor when using the so-called CVD-technique in order, among other things, to deposit substances on the silicon plate by introducing different gases into the reactor. The reactor is configured as a microwave cavity, and one treatment stage involves introducing microwave energy into the reactor from a microwave generator, thereby to heat the silicon plate to a desired temperature, which is measured in a known manner. According to one preferred embodiment, a suitable etching gas is introduced into the cold-wall reactor, and microwave energy is then introduced into the reactor at a power level such as to form a plasma in the reactor, to thereby back-etch a substrate or to clean the reactor from possible impurities contained therein.

16 Claims, 1 Drawing Sheet

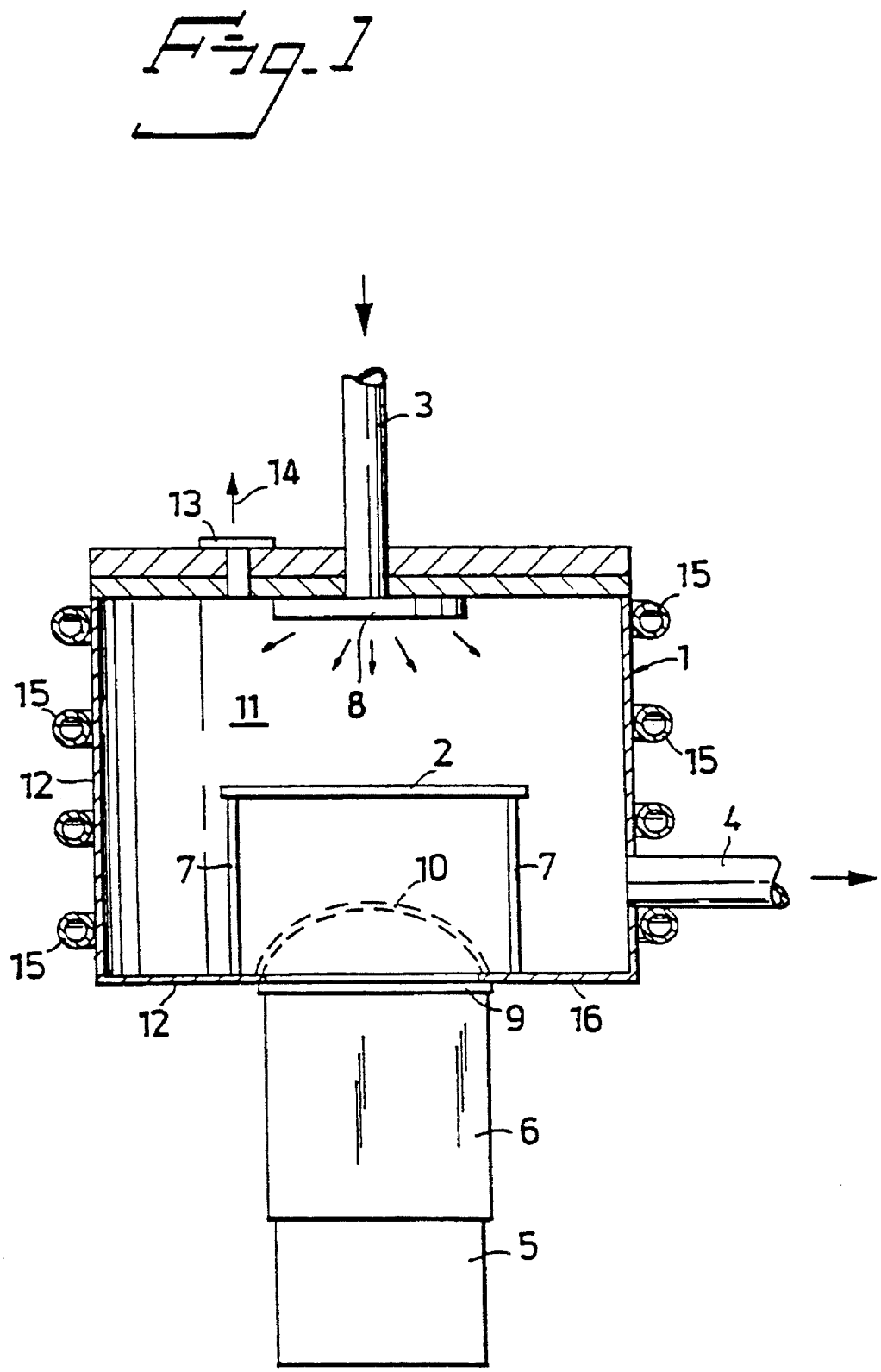

5,491,112

METHOD AND ARRANGEMENT FOR TREATING SILICON PLATES

This application is a continuation, of application Ser. No. 07/781,139, filed as PCT/SE9/00463 Jun. 27, 1990, now abandoned.

BACKGROUND OF THE INVENTION

The present invention relates to a method and an arrangement for treating silicon plates, so-called wafers, for the manufacture of integrated circuits.

1. Field of the Invention

More specifically, the present invention relates to a method of heating so-called wafers, and more particularly so-called single wafers, when manufacturing integrated circuits with the aid of CVD-techniques (Chemical Vapor Deposition), and of so-called back-etching wafers in accordance with a preferred embodiment.

The present invention thus relates to a method of depositing substances by pyrolytic decomposition or heterogenic gas-phase reaction, for instance the deposition of metals, metal silicides or dielectric materials.

2. Description of the Related Art

One type of CVD-reactor is a so-called cold-wall reactor, i.e., the reactor walls are cooled while the substrate is heated. While the substrate is being heated, gases of mutually different compositions and in mutually different mixtures are introduced into the reactor, so as to produce a desired atmosphere with which the desired deposition of one or more substances on the substrate can be achieved.

The known methods of heating the substrate involve heating said substrate by means of infrared radiation from a radiation source in the cold-wall reactor, or heating the wafer to a desired temperature by means of an electrical resistance heating device placed there beneath.

One serious problem with both of these methods is that other parts of the reactor, such as the substrate holder, the thermal radiation window and the process-gas conduits, are heated to such temperatures as to cause the substance or substances to deposit on these components. This deposition of substances on surfaces other than wafer surfaces means that control over the process will be lost after a number of runs have been made, because the deposition rate, the formation of particles and the gas composition will change. Consequently, it is necessary to clean the reactor after only some few runs. The reactor is normally cleansed with a fluorine-containing plasma generated with the aid of a so-called RF-electrode, which is normally operated at a frequency of 13.5 MHz.

It will be noted that as a result of this problem, the reactor will not function in the manner intended after a given number of runs and the result achieved in the furnace will become progressively poorer the more runs that are made after the last furnace cleaning operation.

Another problem related to the use of the aforesaid heating methods in such cold-wall reactors, is that the reactors do not include means for etching the substrate in situ in the reactor. In order to etch the substrate, either to clean the same or to remove deposited and scattered nucleation centers of, e.g., tungsten from silicon dioxide or silicon nitride when depositing thick layers of, e.g., tungsten to fill-in contact holes, it is necessary to move the substrate to another reactor, unless an additional RF-electrode is fitted in the reactor, with presumptive dirtying of the substrate as a result of said transfer. The presence of an additional RF-electrode also constitutes the presence of an additional contaminating source. By depositing and subsequent cleaning, depositing and cleaning, etc., it is possible to maintain selectivity, even in the case of tungsten thicknesses above 10 000 Å.

It can be mentioned by way of example that the aforementioned is particularly significant when applying the CVD-technique with regard to refractory metals and their silicides. The decreasing dimensions and the use of multi-layer metalization makes it necessary, e.g., to find replacement materials for polysilicon as control electrode material and conductor material, and to develop methods of overcoming the problem of covering in stages in multi-layer processes. One possible solution to these problems is the use of tungsten silicide as the control electrode and tungsten as the filling material in contact holes.

It can thus be seen that the ability to move between deposition phases and cleansing phases quickly and simply is becoming progressively more significant. Known cold-wall reactors are unsuitable in this respect, because the different substances used also form deposits on surfaces other than the substrate.

SUMMARY OF THE INVENTION

The present invention solves these problems and provides a cold-wall reactor in which solely the substrate can be heated. This means that deposition will only take place on the surfaces intended and that the need of cleaning the reactor is reduced to a minimum. Furthermore, the invention affords the important advantage of enabling in-situ etching and deposition to take place in one and the same reactor and with one and the same energy source, without needing to transfer the substrate.

The present invention thus relates to a method of treating a silicon plate, a so-called wafer, in a cold-wall reactor while applying the so-called CVD-technique, such as, inter alia, to deposit substances on said wafer by introducing different gases into said reactor, and is characterized in that the reactor is configured as a microwave cavity, and in that one treatment stage comprises introducing into the reactor microwave energy from a microwave generator such as to heat the silicon plate to the desired temperature, said temperature being measured in a known manner.

The present invention also relates to apparatus for treating a silicom plate in a cold-wall reactor when employing the chemical vapor deposition technique.

BRIEF DESCRIPTION OF THE DRAWING

The invention is described below with reference to an exemplifying embodiment of an inventive arrangement illustrated in the accompanying drawing, of which FIG. 1 is a sectional view of an inventive cold-wall reactor.

DESCRIPTION OF THE PREFERRED EMBODIMENTS

FIG. 1 illustrates an inventive arrangement for treating a silicon plate 2, a so-called wafer, in a cold-wall reactor 1 when applying so-called CVD-technique, so as, inter alia, to deposit substances on the silicon plate by introducing different gases into the reactor 1. The reactor 1 includes a gas inlet 3 and a gas outlet 4.

In accordance with the invention, the reactor 1 is configured as a microwave cavity, where a microwave generator 5 is connected to the reactor 1 vial a waveguide 6, said microwave generator 5 being intended to supply microwave energy to the cold-wall reactor, so as to heat the silicon plate 2 to tile temperature desired.

According to one preferred embodiment, the reactor has mounted therein a substrate holder 7 for supporting said substrate, i.e., the silicon plate 2 or the wafer, said holder being made of a material that has a low so-called loss factor, preferably silicon dioxide.

According to a further preferred embodiment of the invention, the walls 12 of the reactor 1, the gas inlet 3 and associated so-called shower 8 are made from a metallic material, preferably stainless steel or aluminium.

The connection between the reactor 1 and the waveguide 6 extending between the microwave generator 5 and the reactor has the form of a flat or bent plate 9 which is made of a material that has a low loss factor, preferably a ceramic material. The plate 9 is intended to form a gas tight shield between the reactor 1 and the waveguide 6. FIG. 1 illustrates a flat plate 9 in full lines, and a bent plate 10 in broken lines. These plates are made of a material whose loss factor is so low that microwaves will pass through the plate from the waveguide 6 to the reactor without heating the plate to any appreciable extent.

According to one highly preferred embodiment, the reactor 1 forms a so-called single-mode cavity, where the mode is preferably TE 112. To this end, the reactor is preferably configured as a cylindrical cavity 11, and the waveguide is connected to the lower end wall 16. The use of the TE 112-mode means that the wafer is placed where the electric field strength is low.

The gas outlet 4 is connected to a vacuum pump (not shown) in a conventional manner, so as to produce a requisite partial vacuum in the reactor, this partial vacuum lying between approximately 100 mtorr and 1 torr. The reactor also includes a window 13 through which temperature can be measured with the aid of a pyrometer, which measures the infrared radiation 14 from the substrate. Extending externally around the reactor 1 are cooling channels 15 which function to carry away heat to a required extent.

The gas inlet 3 can be connected, in a known manner, to a plurality of gas sources for various gases to be introduced into the reactor, such as deposition gases, i.e., gases used in the deposition phase, and gases for back-etching and cleansing purposes. Examples of such gases are Ar, $SiH_4$, $WF_5$, $H_2$, $NF_3$ and $CF_4$, where the two latter gases are typical etching gases.

The microwave generator 5 preferably operates at a frequency of 2450 MHz. It has been found that it is necessary to supply microwave power in the order of 200 W, in order to heat a wafer-to the desired temperature and to produce a plasma in the reactor.

As before mentioned, the present invention relates to the treatment of a silicon plate, a so-called wafer, in the cold-wall reactor. According to one embodiment, this treatment involves the deposition of substances on the wafer by introducing different gases into the reactor in a known manner, these gases causing said substances to be deposited on the wafer when said wafer is heated to a temperature predetermined for said purpose. According to this treatment stage, the wafer is heated by introducing into the reactor 1 microwave energy from the microwave generator 5. This microwave energy is converted to heat in the silicon plate, so as to heat said plate to the temperature desired.

Because the reactor walls, gas conduits, substrate holder, etc. are made from a material which is not heated by the microwave energy, essentially only the wafer will be heated. This means, in turn, that the substances will essentially only be deposited on the substrate and not also on the internal parts of the reactor, as in the case of known heating arrangements which employ IR-radiation or resistance heating of the substrate supporting plate.

It is therefore evident that the aforesaid problem discussed in the introduction is eliminated by means of the present invention. Because said problem is now eliminated, many runs can be made sequentially while maintaining quality and full control over the process, and the reactor need only be cleaned after a very large number of runs.

The actual deposition process is effected in a conventional manner, with the one difference that the wafer is heated by microwave energy. The actual CVD-technique will not therefore be described in detail here.

In another treatment stage in the inventive method, an etching gas of suitable, desired kind, e.g., $CF_4$ or $NF_3$, is introduced into the cold-wall reactor. Microwave energy is introduced into the reactor at a power level such as to produce a plasma in said reactor in order thereby to back-etch a substrate or to clean the reactor of possible impurities. In this way, in-situ etching is achieved with the use of the same energy source as that used to heat the substrate, something which is not possible with the known technique. The advantages afforded by in-situ etching are obvious, since it is no longer necessary to transfer the wafer to other reactors in order to carry out the different working steps. For instance, when a thick layer is to be deposited on the substrate, in order to fill electrical connector holes, partly deposition and partly back-etching processes can be carried out in one and the same reactor, without needing to transfer the substrate.

The microwave generator is shut-off after a deposition phase, and the deposition gas in the reactor is replaced with a gas suitable for producing a plasma, for instance $CF_4$. The microwave generator is then switched-on at a power such as to cause sparking and the generation of a plasma in the reactor. The power needed to generate a plasma depends, among other things, on the gas used, but is normally not higher than the aforesaid power of 200 W, since the etching gases normally have a lower sparking strength than the deposition gases. Subsequent to plasma having formed, the microwave power can normally be lowered from the power which initially prevailed.

The etching gases are then replaced with deposition gases, and microwave energy is introduced into the reactor at a power level at which plasma will not form.

As mentioned in the aforegoing, the plate 10 may have a curved configuration. The curved plate 10 may extend to a much higher position than that shown in FIG. 1, while still lying beneath the wafer, however. Such a cup-shaped plate affords the advantage of ensuring that a plasma can be more readily formed and sustained in the upper part of the reactor.

It is evident that the present invention solves the problems mentioned in the introduction and enables the process of treating wafers to be simplified, among other things, by in-situ etching.

It will be understood that modifications can also be made. For instance, the reactor may be given a different configuration and the microwave energy can be introduced in a manner different to that exemplified above. Furthermore, more than one microwave generator can be used.

The present invention is therefore not restricted to the aforedescribed and illustrated exemplifying embodiments, since modifications and variations can be made within the scope of the following claims.

We claim:

1. A method for treating a silicon plate in a reactor during chemical vapor deposition, for the purpose, inter alia, of depositing substances on the silicon plate by introducing different gases into the reactor, said method comprising the steps of:
   a. providing a cold-wall reactor defining a microwave cavity having cooled cavity-defining walls and having a gas inlet;
   b. providing a microwave generator and a waveguide for introducing microwaves into the microwave cavity;
   c. positioning a substrate holder within the microwave cavity and spaced from the waveguide, wherein the substrate holder is made from a material that has a low loss factor;
   d. placing on the substrate holder a silicon plate onto which substances are to be deposited; and
   e. introducing microwave energy into the reactor microwave cavity from the microwave generator to heat the silicon plate to a desired temperature.

2. A method according to claim 1, including the steps of: introducing into the cold-wall reactor an etching gas of suitable, desired kind; and introducing the microwave energy into the reactor at a power level such as to generate a plasma in the cold-wall reactor and thereby back-etch a substrate or clean the reactor from possible impurities therein.

3. A method according to claim 1 wherein the substrate holder is made from silicon dioxide.

4. A method according to claim 1, including the step of constructing the reactor walls and the gas inlet from a metallic material selected from the group consisting of stainless steel or aluminum.

5. A method according to claim 1, including the steps of: providing as a connection between the reactor and a waveguide extending between the microwave generator and the reactor a plate constructed from a material having a low loss factor, and mounting said plate in a manner to form a gas-tight screen between the reactor and the waveguide.

6. A method according to claim 1, wherein the reactor is configured as a single-mode cavity.

7. A method according to claim 1, wherein the reactor is a cylindrical cavity with the waveguide connected to a bottom end-wall thereof.

8. A method according to claim 1, wherein the mode of operation used is TE 112.

9. Apparatus for treating a silicon plate in a reactor during chemical vapor deposition to deposit substances on the silicon plate by introducing different gases into the reactor, said apparatus comprising: a reactor including a gas inlet and a gas outlet, wherein the reactor is a cold-wall reactor that defines a microwave cavity; a substrate holder mounted in the microwave cavity, the holder made of a material having a low loss factor; and a microwave generator connected to the reactor to deliver microwave energy to the cold-wall reactor, so as thereby to heat the silicon plate to a desired temperature.

10. Apparatus according to claim 9, wherein the substrate holder is made from silicon dioxide.

11. Apparatus according to claim 9, wherein the reactor walls and the gas inlet are constructed from a metallic material selected from the group consisting of stainless steel or aluminum.

12. Apparatus according to claim 9, including a microwave waveguide positioned between the microwave generator and said reactor, and a plate which is made of a material that has a low loss factor is positioned between the waveguide and the reactor, said plate providing a gas-tight screen between the reactor and the waveguide.

13. Apparatus according to claim 9, wherein the reactor is a single-mode cavity.

14. Apparatus according to claim 9, wherein the reactor defines a cylindrical cavity with a microwave waveguide connected to a bottom end-wall thereof.

15. A method for treating a substrate in a reactor during chemical vapor deposition, for the purpose of depositing substances on the substrate by introducing different gases into the reactor, said method comprising the steps of:
   a. providing a reactor including a microwave cavity formed by cavity-defining walls, the reactor having a gas inlet and a gas outlet communicating with the cavity;
   b. providing a microwave generator and a waveguide adjacent to the reactor for introducing microwaves through a reactor wall into the reactor cavity, wherein the waveguide includes a longitudinal axis;
   c. providing a substrate holder within the reactor cavity, the substrate holder having a longitudinal axis that is substantially coaxially aligned with the waveguide longitudinal axis for supporting a substrate in spaced relationship with the cavity wall, wherein the substrate holder is made from a material that has a low loss factor and includes a substrate supporting surface extending transversely relative to the longitudinal axis of the substrate holder:
   d. placing on the substrate-supporting surface of the substrate holder a substrate onto which substances are to be deposited;
   e. introducing microwave energy into the reactor cavity from the microwave generator to heat the substrate to a desired temperature;
   f. maintaining the temperature of the reactor walls below a vapor deposition temperature;
   g. forming a coating on the heated substrate by introducing gases into the reactor cavity through the gas inlet for deposition of a coating substance onto the heated substrate;
   h. after forming the coating, simultaneous with the introduction of additional microwave energy into the reactor cavity, introducing into the reactor cavity through the gas inlet an etching gas; and
   i. maintaining the microwave energy introduced into the reactor at a power level sufficient to produce a plasma from the etching gas to etch a surface of the substrate and to clean the reactor walls of possible impurities.

16. Apparatus for treating a substrate in a reactor cavity during chemical vapor deposition to deposit substances on the substrate by introducing different gases into the reactor, said apparatus comprising: a reactor including a gas inlet and a gas outlet, the reactor defining a microwave cavity; a microwave generator and a waveguide positioned adjacent the reactor cavity to introduce microwave radiation into the reactor cavity for heating a substrate positioned within the reactor cavity, the waveguide having a longitudinal axis; a substrate holder within the reactor cavity for supporting a substrate, the substrate holder having a longitudinal axis and positioned in substantially coaxial alignment with the longitudinal axis of the waveguide to space the substrate from a wall of the reactor and in a position to receive microwave radiation from the microwave generator; means for maintaining the temperature of the reactor walls below a vapor deposition temperature; and a closure plate between the waveguide and the reactor cavity for providing a gas-tight shield to prevent flow of gases from the reactor cavity to the microwave generator, wherein the substrate holder is made from a material that has a low loss factor to permit the passage therethrough of microwaves without substantial heating of the substrate holder.

* * * * *